United States Patent
Dono et al.

(10) Patent No.: US 7,652,904 B2
(45) Date of Patent: Jan. 26, 2010

(54) SEMICONDUCTOR MEMORY DEVICE HAVING PLURAL MEMORY CELL ARRAYS

(75) Inventors: Chiaki Dono, Tokyo (JP); Yasuji Koshikawa, Tokyo (JP); Jun Suzuki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/956,448

(22) Filed: Dec. 14, 2007

(65) Prior Publication Data

US 2008/0144346 A1 Jun. 19, 2008

(30) Foreign Application Priority Data

Dec. 19, 2006 (JP) ............................. 2006-341190

(51) Int. Cl.
*G11C 5/02* (2006.01)
(52) U.S. Cl. ..................... 365/51; 365/63; 365/220; 365/230.03
(58) Field of Classification Search .................. 365/220
See application file for complete search history.

(56) References Cited

U.S. PATENT DOCUMENTS

| 5,604,710 | A | * | 2/1997 | Tomishima et al. | ..... 365/230.03 |
| 5,619,472 | A | * | 4/1997 | Okamura | ............... 365/230.03 |
| 5,642,323 | A | * | 6/1997 | Kotani et al. | ........... 365/230.03 |
| 6,560,134 | B2 | * | 5/2003 | Brox et al. | ..................... 365/51 |
| 7,403,408 | B2 | * | 7/2008 | Otori et al. | ..................... 365/51 |

FOREIGN PATENT DOCUMENTS

| JP | 2002-230976 | 8/2002 |
| JP | 2003-100073 | 4/2003 |

* cited by examiner

*Primary Examiner*—Tan T. Nguyen
(74) *Attorney, Agent, or Firm*—Young & Thompson

(57) ABSTRACT

A semiconductor memory device includes first and second bus regions, a third bus region laid out along a center line, a first cell region laid out between a first side and the first bus region, a second cell region laid out between a second side and the second bus region, third and fourth cell regions laid out between the first and second bus regions and laid out toward a third side and a fourth side respectively seen from the third bus region, and a data input/output pad string laid out along the third bus region.

22 Claims, 9 Drawing Sheets

SEMICONDUCTOR MEMORY DEVICE HAVING PLURAL MEMORY CELL ARRAYS

TECHNICAL FIELD

The present invention relates to a semiconductor memory device, and, more particularly to a semiconductor memory device having plural memory cell arrays.

BACKGROUND OF THE INVENTION

The memory capacity of a semiconductor memory device represented by a DRAM (Dynamic Random Access Memory) has increased every year. Along with this, proper selection of a chip floor plan has become important from cost and characteristic viewpoints. The "floor plan" means a total layout on a chip, such as the layout of plural memory cell arrays and peripheral circuits, the layout of data input/output pad strings (DQ pad strings), and the layout of data input/output buses (I/O buses).

Elements that determine the floor plan of a chip are circuit characteristics and a chip area required, and constraints at the module mounting. The floor plan needs to be determined by taking these elements into consideration. Focusing attention on the circuit characteristic out of these elements, it is preferable to suppress a difference between far and near ends, by setting a planar shape of a chip to substantially square. The chip having a substantially square planar shape can be easily employed in a semiconductor memory device having a four-bank structure that has conventionally been a main trend. In other words, in the four-bank structure, these banks can be laid out in two columns and in two rows.

However, a recent product having a large memory capacity, particularly a memory capacity equal to or larger than one Gbits, has a structure of eight or more banks in many cases. When a product has eight banks, for example, these banks are usually laid out in two columns and four rows, as a floor plan. In this case, a difference in the horizontal to vertical ratio of the chip becomes large, thereby increasing the difference between far and near ends.

On the other hand, in the chip of eight-bank structure, there is also known a floor plan having these banks laid out in three columns and three rows, with peripheral circuits laid out in concentration at the center (see Japanese Patent Applications Laid-open Nos. 2002-230976 and 2003-100073). However, in the floor plan having the peripheral circuits laid out in concentration at the center, the layouts of the DQ pad strings and the I/O buses easily give a large influence to the circuit characteristic. Therefore, the floor plan including the layouts of the DQ pad strings and the I/O buses needs to be selected more carefully.

Particularly, according to the common semiconductor memory device, the input/output data width, that is, the number of data bits simultaneously input or output, is variable, and the input/output data width can be selected by a fuse option method or a bonding option method. In this case, according to the floor plan of laying out the peripheral circuits in concentration at the center, the characteristics change easily depending on the selected input/output data width.

SUMMARY OF THE INVENTION

It is therefore an object of the present invention to provide an improved semiconductor memory device having plural memory cell arrays.

It is another object of the present invention to provide an improved semiconductor memory device having a floor plan in which peripheral circuits are laid out in concentration at the center of a chip.

It is still another object of the present invention to provide a semiconductor memory device having characteristics that do not easily change depending on a selected input/output data width.

The above and other objects of the present invention can be accomplished by a semiconductor memory device having a square planar shape, and having first and second sides extending in a first direction and third and fourth sides extending in a second direction intersecting with the first direction, the semiconductor memory device comprising:

first and second bus regions extending in the first direction;

a third bus region laid out along a center line separating the semiconductor memory device into two in the first direction;

a first cell region laid out between the first side and the first bus region;

a second cell region laid out between the second side and the second bus region;

a third cell region laid out between the first bus region and the second bus region and located at the third side seen from the third bus region;

a fourth cell region laid out between the first bus region and the second bus region and located at the fourth side seen from the third bus region; and a data input/output pad string laid out along the third bus region.

In the present invention, it is preferable that the data input/output pad string includes first and second groups each including n data input/output pads. In this case, the semiconductor memory device inputs/outputs data using the first group without using the second group, when the input/output data width is set to n bits, and inputs/outputs data using the first and second groups in parallel, when the input/output data width is set to 2n bits.

It is preferable that a first data input/output bus formed in the first bus region can transfer data to/from the data input/output pads constituting the first group of the data input/output pad string, and a second data input/output bus formed in the second bus region can transfer data to/from the data input/output pads constituting either the first group or the second group of the data input/output pad string. Further, it is particularly preferable that a third data input/output bus formed in the third bus region includes a first part connected to the first data input/output bus, and a second part connected to the second data input/output bus, and wiring lengths of the first part and the second part of the third data input/output bus are substantially equal to each other.

It is preferable that a plurality of memory cell arrays connected to the first group of the data input/output pad string when the input/output data width is set to 2n bits, are laid out in the first cell region, and a plurality of memory cell arrays connected to the second group of the data input/output pad string when the input/output data width is set to 2n bits, are laid out in the second cell region.

It is preferable that peripheral circuits are laid out in concentration between the third cell region and the fourth cell region.

According to the present invention, the first to fourth cell regions are laid out along the first to fourth sides of a chip. Therefore, peripheral circuits can be laid out in concentration at the center of the chip. Because this arrangement makes the planar shape of the chip approximately square, the difference between far and near ends can be suppressed.

A third bus region is laid out along the center line which separates the chip into two in a first direction, and a data input/output pad string (a DQ pad string) is laid out along the third bus region. Therefore, there is substantially no change in the difference between far and near ends of the data input/output bus (I/O bus) even when the input/output data width is changed. Consequently, characteristics do not change easily depending on the selected input/output data width, and excellent circuit characteristics can be obtained.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained below in detail with reference to the accompanying drawings.

Figure 1:
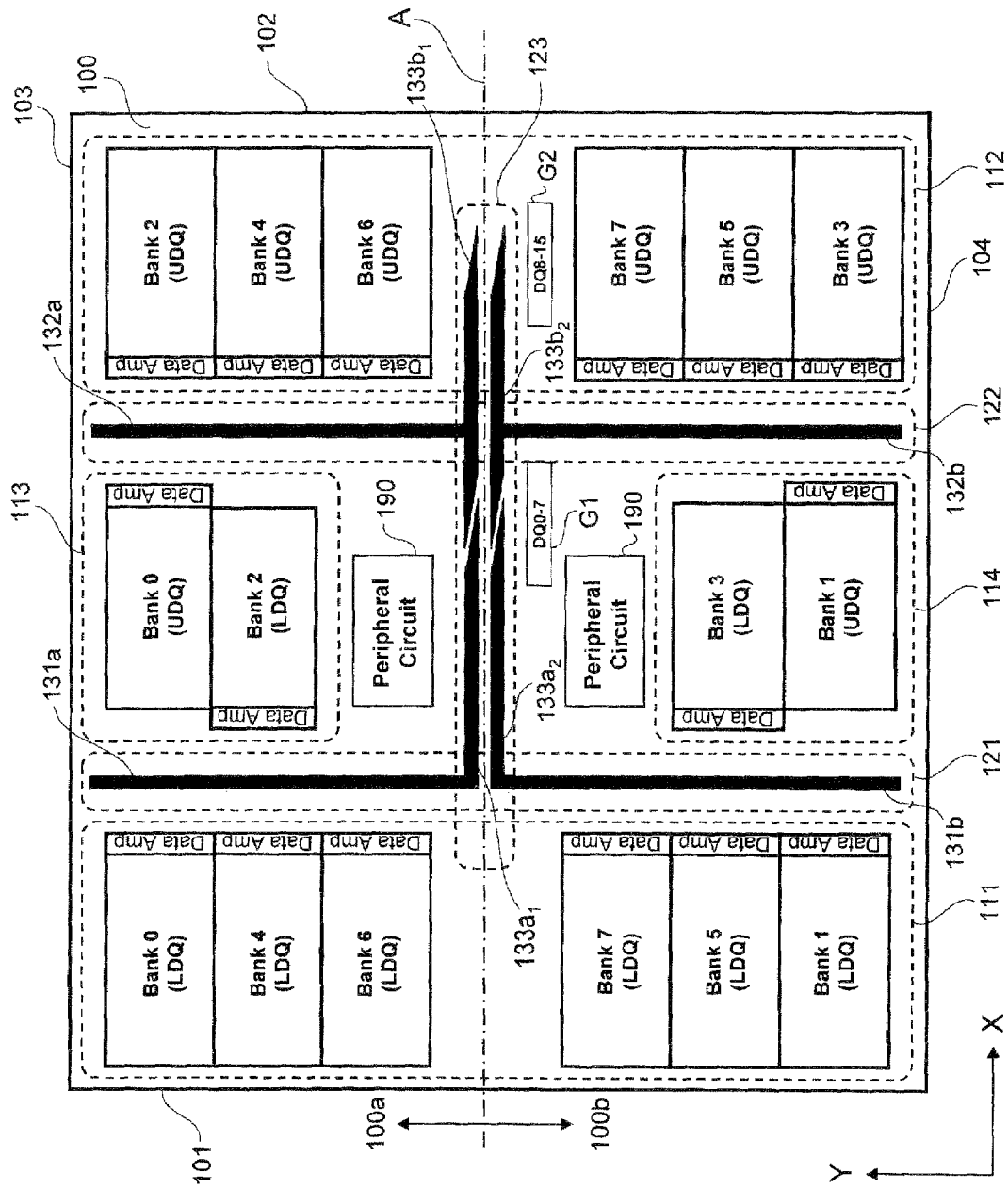
FIG. 1 is a schematic plan view for explaining a floor plan of a semiconductor memory device according to a first embodiment of the present invention.

FIG. 1 is a schematic plan view for explaining a floor plan of a semiconductor memory device according to a first embodiment of the present invention.

The semiconductor memory device according to the first embodiment is a DRAM, for example, and has an eight-bank structure. A command can be individually given to each of the eight banks, Bank 0 to Bank 7, so that these banks can operate independently. As shown in FIG. 1, the eight banks Bank 0 to Bank 7 are separated into low-side memory cell arrays and high-side memory cell arrays, respectively. In FIG. 1, the low-side memory cell array is indicated by LDQ, and the high-side memory cell array is indicated by UDQ. In the first embodiment, a data width each memory cell array can simultaneously input or output is eight bits. Data is transmitted to or received from corresponding data input/output buses (I/O buses) via a data amplifier.

In the semiconductor memory device according to the first embodiment, the data input/output pad string (the DQ pad string) includes 16 data input/output pads. In other words, a maximum input/output data width is 16 bits. However, the input/output data width is not necessarily fixed to 16 bits, and can be changed to eight bits (or four bits), based on the fuse option or the bonding option.

As shown in FIG. 1, the DQ pad string is divided into a first group G1 including eight data input/output pads DQ0 to DQ7, and a second group G2 including eight data input/output pads DQ8 to DQ15. To set the input/output data width to 16 bits, 16-bit data is input or output using the groups G1 and G2 in parallel. To set the input/output data width to eight bits, eight-bit data is input or output using only the group G1.

When the input/output data width is set to 16 bits, the low-side memory cell array LDQ and the high-side memory cell array UDQ forming the same bank are operated in parallel. Accordingly, out of the 16-bit input/output data, the eight-bit data corresponding to the data input/output pads DQ0 to DQ7 are allocated to the low-side memory cell array LDQ, and the eight-bit data corresponding to the data input/output pads DQ8 to DQ15 are allocated to the high-side memory cell array UDQ. On the other hand, when the input/output data width is set to eight bits, the low-side memory cell array LDQ and the high-side memory cell array UDQ forming the same bank are operated separately. Accordingly, the low-side memory cell array LDQ or the high-side memory cell array UDQ are accessed according to the address.

The floor plan of the semiconductor memory device according to the first embodiment is explained in further detail.

As shown in FIG. 1, in the semiconductor memory device according to the first embodiment, the planar shape of the chip 100 is quadrangular, and has a shape close to a square. The chip 100 has a first side 101 and a second side 102 extending in the Y direction, and a third side 103 and a fourth side 104 extending in the X direction.

Around the chip 100, there are a first cell region 111 to a fourth cell region 114 laid out along the first side 101 to the fourth side 104, respectively. As shown in FIG. 1, the first cell region 111 is laid out between the first side 101 of the chip 100 and a first bus region 121 extending in the Y direction. The second cell region 112 is laid out between the second side 102 of the chip 100 and a second bus region 122 extending in the Y direction. Further, the third cell region 113 and the fourth cell region 114 are laid out between the bus regions 121 and 122. The third cell region 113 is laid out toward the third side 103 seen from a third bus region 123 extending in the X direction, and the fourth cell region 114 is laid out toward the fourth side 104 seen from the third bus region 123.

Peripheral circuits 190 are laid out in concentration at the center of the chip 100, that is, between the cell regions 113 and 114.

As shown in FIG. 1, the low-side memory cell arrays LDQ of Banks 0, 1, and 4 to 7 are laid out in the first cell region 111, and the high-side memory cell arrays UDQ of Banks 2 to 7 are laid out in the second cell region 112. The high-side memory cell array UDQ of Bank 0, and the low-side memory cell array LDQ of Bank 2 are laid out in the third cell region 113. The high-side memory cell array UDQ of Bank 1, and the low-side memory cell array LDQ of Bank 3 are laid out in the fourth cell region 114.

Out of the six memory cell arrays laid out in the first cell region 111, the memory cell arrays constituting Banks 0, 4, and 6 are laid out toward the third side 103 seen from a center line A separating the chip 100 into two in the Y direction, and the memory cell arrays constituting Banks 1, 5, and 7 are laid out toward the fourth side 104 seen from the center line A. Out of the six memory cell arrays laid out in the second cell region 112, the memory cell arrays constituting Banks 2, 4, and 6 are laid out toward the third side 103 seen from the center line A, and the memory cell arrays constituting Banks 3, 5, and 7 are laid out toward the fourth side 104 seen from the center line A.

Based on this layout, in an upper region 100a including positions located toward the third side 103 seen from the center line A in the cell regions 111 and 112, and the cell region 113, all memory cell arrays constituting even banks are laid out. On the other hand, in a lower region 100b including positions located toward the fourth side 104 seen from the center line A in the cell regions 111 and 112, and the cell region 114, all memory cell arrays constituting odd banks are laid out. The four banks laid out in the upper region 100a can be accessed when the lowest bit of the bank address is "0", and the four banks laid out in the lower region 100b can be accessed when the lowest bit of the bank address is "1".

A first data input/output bus (I/O bus) 131 for exchanging data with the low-side memory cell arrays LDQ of Banks 0 to 7 is formed in the first bus region 121. A second data input/output bus (I/O bus) 132 for exchanging data with the high-side memory cell arrays UDQ of Banks 0 to 7 is formed in the second bus region 122.

The third bus region 123 is provided along the center line A that separates the chip 100 into two in the Y direction. A third data input/output bus (I/O bus) 133 formed in the third bus region 123 includes a first part 133a connected to the I/O bus 131, and a second part 133b connected to the I/O bus 132. As shown in FIG. 1, the first part 133a can be connected to the group G1 of the DQ pad string, and the second part 133b can be connected to the groups G1 and G2 of the DQ pad string. As shown in FIG. 1, a wiring length of the first part 133a is substantially equal to a wiring length of the second part 133b.

Based on this structure, the low-side memory cell arrays LDQ of Banks 0 to 7 are connected to the data input/output pads DQ0 to DQ7, via the I/O bus 131 and the first part 133a of the I/O bus 133. On the other hand, the high-side memory cell arrays UDQ of Banks 0 to 7 are connected to the data input/output pads DQ0 to DQ7 or DQ8 to DQ15, via the I/O bus 132 and the second part 133b of the I/O bus 133.

As shown in FIG. 1, the DQ pad string is laid out along the third bus region 123. Out of the string, the DQ pads DQ0 to DQ7 constituting the group G1 are laid out between the bus regions 121 and 122, and the DQ pads DQ8 to DQ15 constituting the group G2 are laid out between the second side 102 and the bus region 122. The DQ pads DQ0 to DQ7 are laid out near the boundary between the first part 133a and the second part 133b of the data input/output bus 133. This arrangement allows connection of the DQ pads DQ0 to DQ7 to any one of the first part 133a and the second part 133b.

In the first embodiment, the I/O bus 131 is also separated into a first part 131a and a second part 131b. The first part 131a of the I/O bus 131 is located toward the third side 103 seen from the center line A, and the second part 131b of the I/O bus 131 is located toward the fourth side 104 seen from the center line A.

The first part 131a of the I/O bus 131 is connected to the memory cell arrays located toward the third side 103 seen from the center line A, out of the memory cell arrays laid out in the cell region 111, and to the low-side memory cell array LDQ of Bank 2 laid out in the cell region 113. On the other hand, the second part 131b of the I/O bus 131 is connected to the memory cell arrays located toward the fourth side 104 seen from the center line A, out of the memory cell arrays laid out in the cell region 111, and to the low-side memory cell array LDQ of Bank 3 laid out in the cell region 114.

Similarly, the I/O bus 132 is separated into a first part 132a and a second part 132b. The first part 132a of the I/O bus 132 is located toward the third side 103 seen from the center line A, and the second part 132b of the I/O bus 132 is located toward the fourth side 104 seen from the center line A.

The first part 132a of the I/O bus 132 is connected to the memory cell arrays located toward the third side 103 seen from the center line A, out of the memory cell arrays laid out in the cell region 112, and to the high-side memory cell array UDQ of Bank 0 laid out in the cell region 113. On the other hand, the second part 132b of the I/O bus 132 is connected to the memory cell arrays located toward the fourth side 104 seen from the center line A, out of the memory cell arrays laid out in the cell region 112, and to the high-side memory cell array UDQ of Bank 1 laid out in the cell region 114.

In the first embodiment, the first part 131a of the I/O bus 131 is connected to a half $133a_1$ of the first part 133a of the I/O bus 133, and the second part 131b of the I/O bus 131 is connected to the other half $133a_2$ of the first part 133a of the I/O bus 133. Each of the half $133a_1$ and the other half $133a_2$ of the first part 133a includes eight pairs (16) of wiring patterns. Therefore, the first part 133a of the I/O bus 133 includes 16 pairs (32) of wiring patterns.

Similarly, the first part 132a of the I/O bus 132 is connected to a half $133b_1$ of the second part 133b of the I/O bus 133, and the second part 132b of the I/O bus 132 is connected to the other half $133b_2$ of the second part 133b of the I/O bus 133. Each of the half $133b_1$ and the other half $133b_2$ of the second part 132a includes eight pairs (16) of wiring patterns. Therefore, the second part 133b of the I/O bus 133 includes 16 pairs (32) of wiring patterns.

Figure 2:
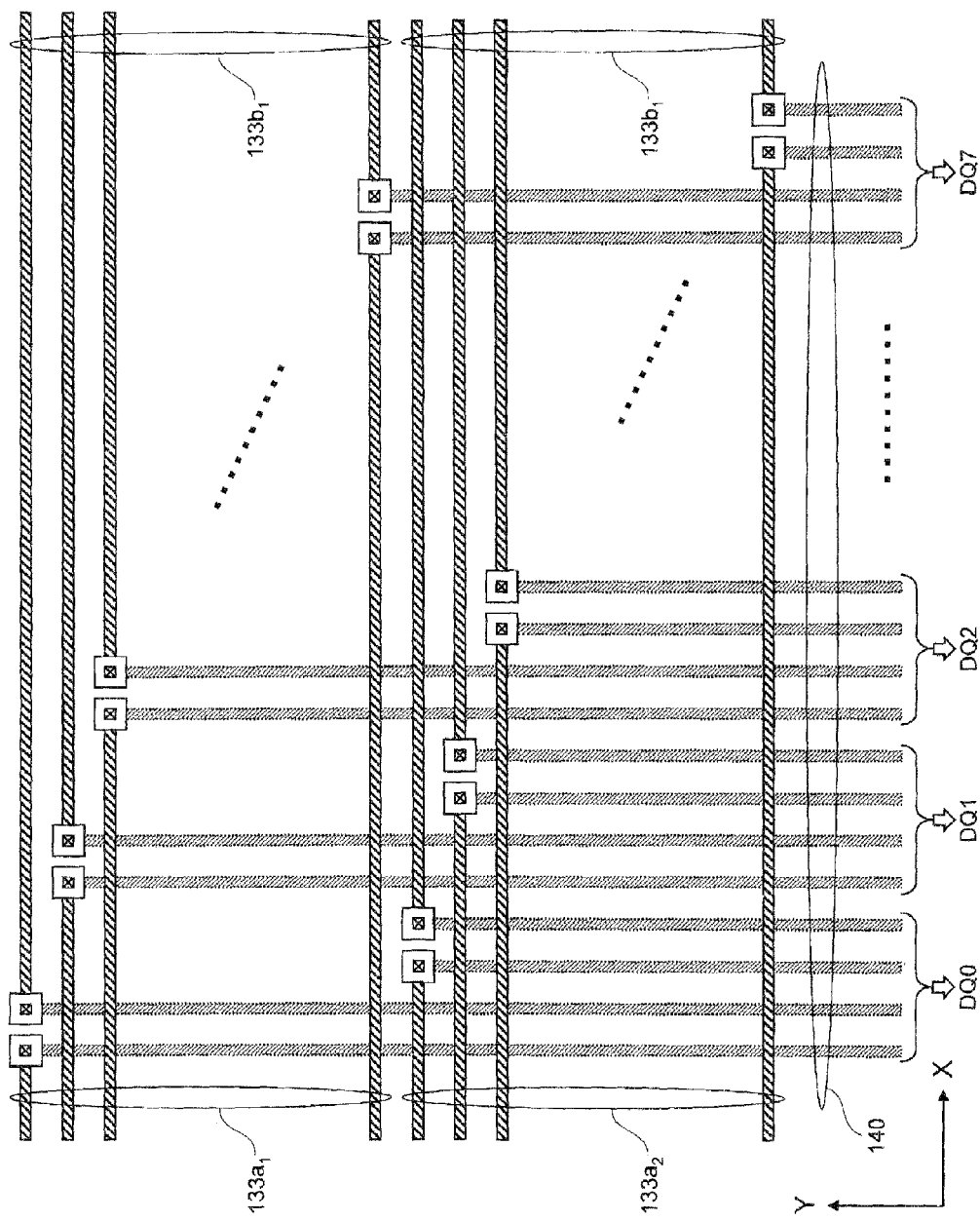
FIG. 2 is a plan view schematically showing the wiring structure at the boundary between the first part and the second part of the I/O bus shown in FIG. 1.

FIG. 2 is a plan view schematically showing the wiring structure at the boundary between the first part 133a and the second part 133b of the I/O bus 133.

As shown in FIG. 2, 32 wiring patterns constituting the I/O bus 133 all extend in the X direction, and are connected to wiring patterns 140 formed in the lower layer (or the upper layer) in the end region where the first part 133a and the second part 133b face each other. The wiring patterns 140 formed in the lower layer (or the upper layer) extend in the Y direction, and are connected to corresponding input/output circuits (not shown) for the DQ pads DQ0 to DQ7.

As shown in FIG. 2, the boundaries between the first part 133a and the second part 133b are formed each being shifted in the X direction. This is to lay out the wiring patterns 140 closely without interference because the wiring patterns 140 formed in the lower layer (or the upper layer) all extend in the Y direction. In FIG. 1, the ends of the first part 133a and the second part 133b of the I/O bus 133 are shown on a slant. This indicates that these ends are formed, each being shifted in the X direction.

The floor plan of the semiconductor memory device according to the first embodiment is as explained above. As explained above, according to the first embodiment, plural memory cell arrays are laid out along the first side 101 to the fourth side 104 of the chip 100. Therefore, the peripheral circuits 190 can be laid out in concentration at the center of the chip 100. Consequently, the chip 100 can be formed in a planar shape close to a square, thereby suppressing the difference between far and near ends.

Further, the DQ pad string is laid out along the third bus region 123, and the wiring lengths of the first part 133a and the second part 133b of the I/O bus 133 are set substantially equal. Therefore, the parasitic capacitance of the total I/O buses connected to the low-side memory cell array LDQ substantially coincides with the parasitic capacitance of the total I/O buses connected to the high-side memory cell array UDQ. Consequently, substantially no change occurs in characteristics between when the high-side memory cell array UDQ is connected to the group G1 (when the input/output data width is eight bits) and when the high-side memory cell array UDQ is connected to the group G2 (when the input/output data width is 16 bits). Accordingly, in the semiconductor memory device according to the first embodiment, the characteristics do not change easily depending on the selected input/output data width, and excellent circuit characteristics can be obtained.

On the other hand, the floor plans described in Japanese Patent Applications Laid-open Nos. 2002-230976 and 2003-100073 are optimized for the case that the input/output data width is a predetermined number of bits (for example, 16 bits). Therefore, when the input/output data width is attempted to be set to eight bits (or four bits), for example, the I/O bus connecting between the high-side memory cell array UDQ and the group G1 becomes very long, and the difference between far and near ends becomes significant. According to the first embodiment, this problem little occurs, and excellent circuit characteristics can be obtained regardless of the input/output data width.

Further, in the first embodiment, the group G1 is laid out between the bus regions 121 and 122. Therefore, when the input/output data width is eight bits, there is a little difference between a distance from the low-side memory cell array LDQ to the group G1 and a distance from the high-side memory cell array UDQ to the group G.

The semiconductor memory device according to the first embodiment separately includes the I/O bus corresponding to the even banks, and the I/O bus corresponding to the odd banks. Therefore, the wiring length of each wiring pattern constituting the I/O bus can be shortened. As a result, the parasitic capacitance of the total I/O buses can be decreased, and data can be transferred at a higher speed.

Other embodiments of the present invention are explained below.

Figure 3:
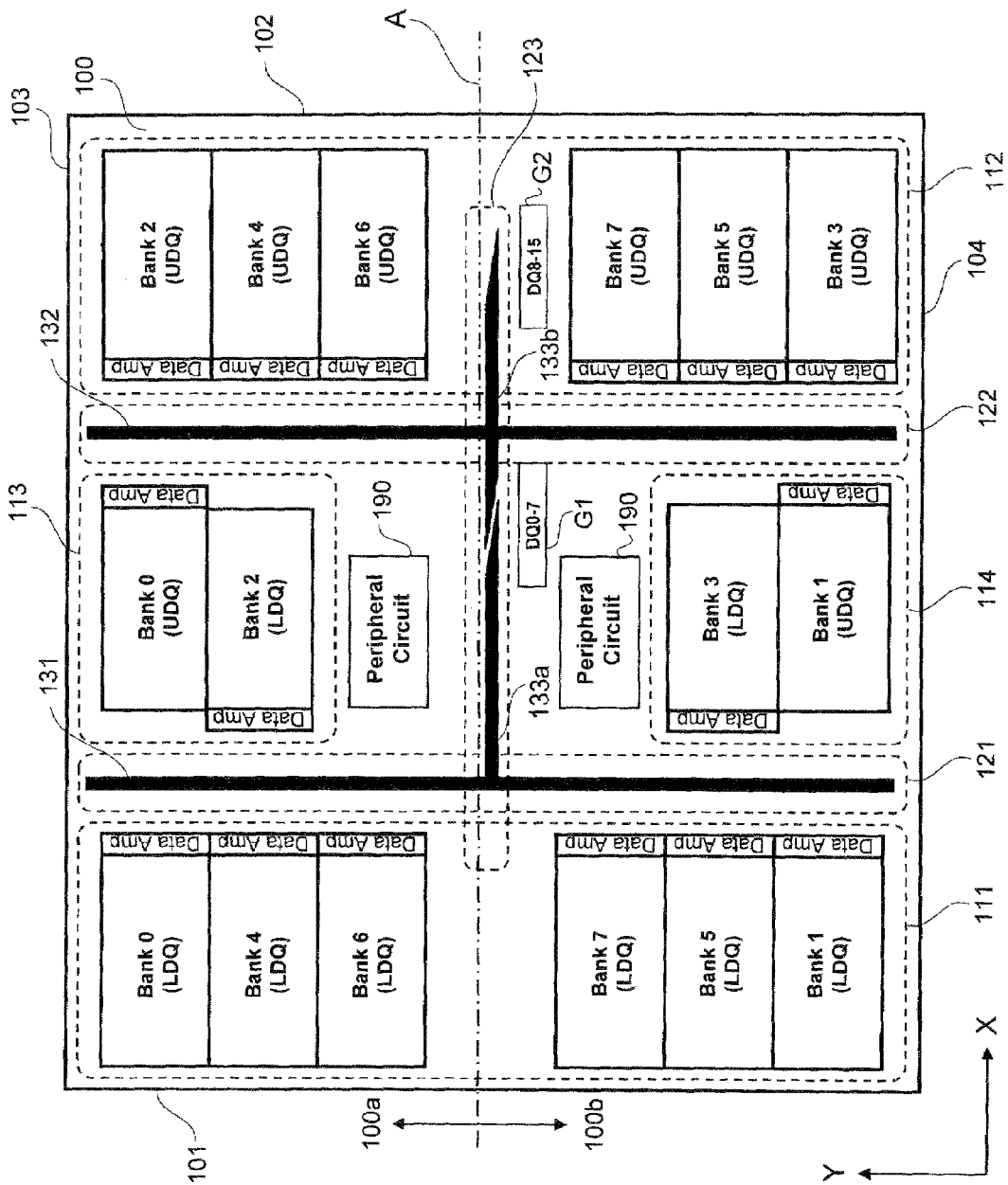
FIG. 3 is a schematic plan view for explaining a floor plan of a semiconductor memory device according to a second embodiment of the present invention.

FIG. 3 is a schematic plan view for explaining a floor plan of a semiconductor memory device according to a second embodiment of the present invention.

As shown in FIG. 3, in the semiconductor memory device according to the second embodiment, the first part 131a and the second part 131b of the I/O bus 131 are shortcircuited, and are connected in common to the first part 133a of the I/O bus 133. Similarly, the first part 132a and the second part 132b of the I/O bus 132 are shortcircuited, and are connected in common to the second part 133b of the I/O bus 133. With this arrangement, the number of the I/O buses 133 is halved. In other words, each of the first part 133a and the second part 133b of the I/O bus 133 includes eight pairs (16) wiring patterns. Other points are the same as those of the first embodiment. Therefore, elements identical with those of the first embodiment are assigned with like reference numerals, and redundant explanations thereof will be omitted.

With this structure, in the semiconductor memory device according to the second embodiment, the occupied area of the third bus region 123 can be decreased more than that according to the first embodiment.

Figure 4:
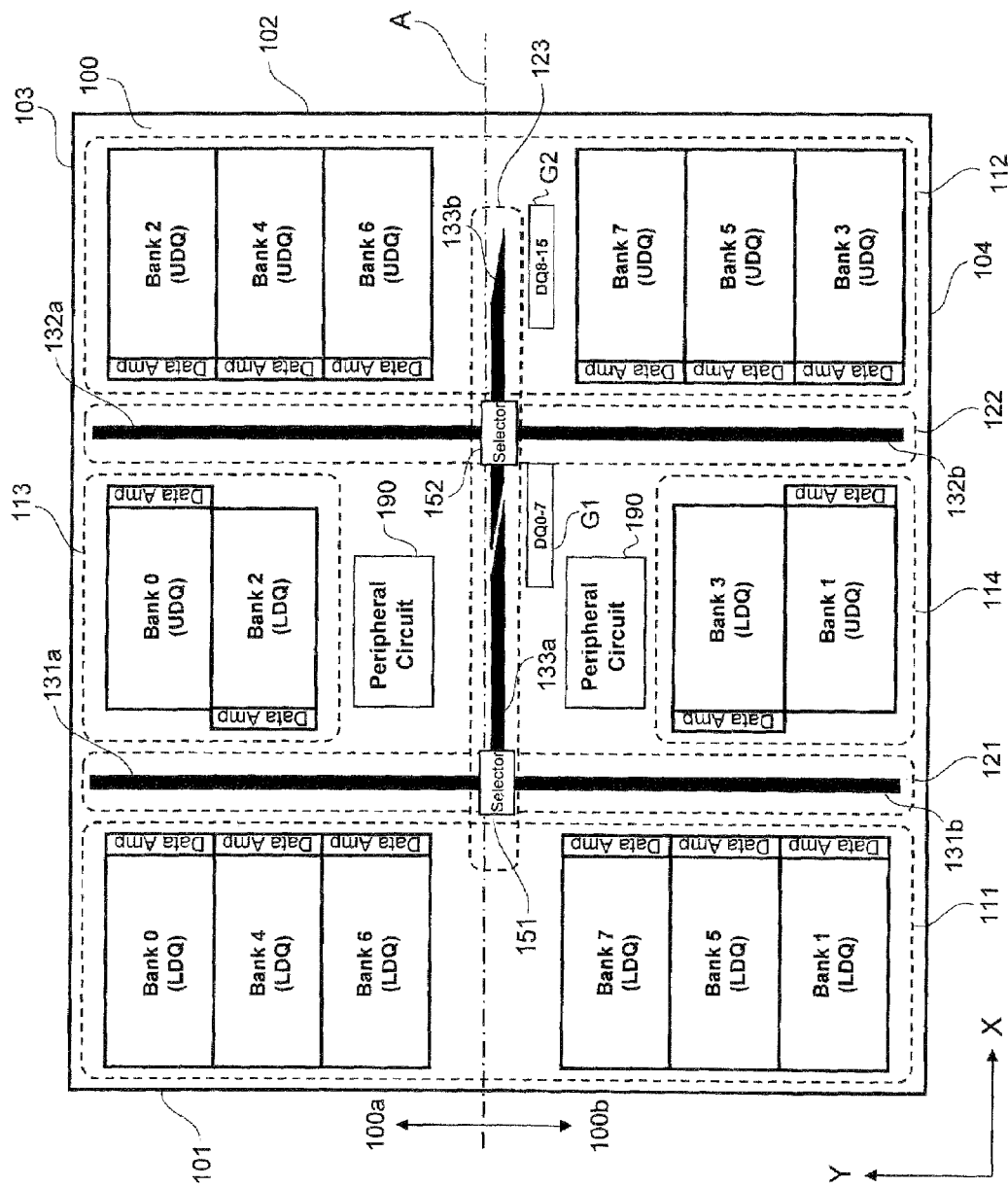
FIG. 4 is a schematic plan view for explaining a floor plan of a semiconductor memory device according to a third embodiment of the present invention.

FIG. 4 is a schematic plan view for explaining a floor plan of a semiconductor memory device according to a third embodiment of the present invention.

As shown in FIG. 4, in the semiconductor memory device according to the third embodiment, a selector 151 is provided at a connection part between the first part 131a and the second part 131b of the I/O bus 131. Similarly, a selector 152 is provided at a connection part between the first part 132a and the second part 132b of the I/O bus 132. Other points are the same as those of the second embodiment. Therefore, elements identical with those of the second embodiment are assigned with like reference numerals, and redundant explanations thereof will be omitted.

The selector 151 is a circuit that connects any one of the first part 131a and the second part 131b of the I/O bus 131 to the first part 133a of the I/O bus 133. Similarly, the selector 152 is a circuit that connects any one of the first part 132a and the second part 132b of the I/O bus 132 to the second part 133b of the I/O bus 133.

With this structure, in the semiconductor memory device according to the third embodiment, the parasitic capacitance of the total I/O buses can be decreased more than that according to the second embodiment.

Figure 5:
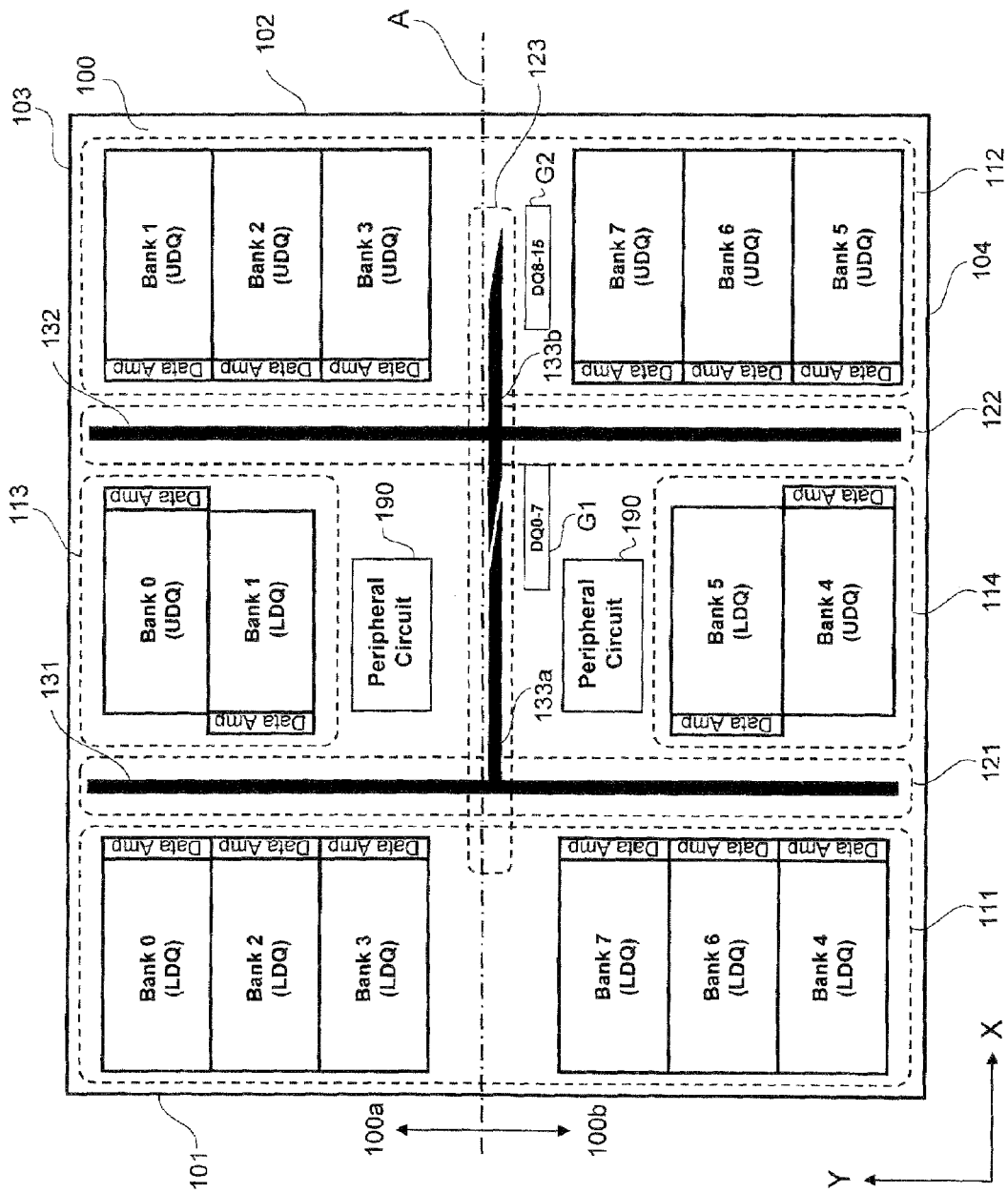
FIG. 5 is a schematic plan view for explaining the floor plan of the semiconductor memory device according to a fourth embodiment of the present invention.

FIG. 5 is a schematic plan view for explaining the floor plan of the semiconductor memory device according to a fourth embodiment of the present invention.

As shown in FIG. 5, in the semiconductor memory device according to the fourth embodiment, the layout of the memory cell arrays is different from that according to the second embodiment. In other words, all memory cell arrays constituting the lower banks are laid out in the upper region 100a of the chip 100. On the other hand, all memory cell arrays constituting the upper banks are laid out in the lower region 100b of the chip 100. Other points are the same as those of the second embodiment. Therefore, elements identical with those of the second embodiment are assigned with like reference numerals, and redundant explanations thereof will be omitted.

The four banks laid out in the upper region 100a can be accessed when the highest bit of the bank address is "0", and the four banks laid out in the lower region 100b can be accessed when the highest bit of the bank address is "1". In this structure, effect similar to that in the second embodiment can be also obtained.

As explained above, in the present invention, which banks are to be laid out in the upper region 100a and which banks are to be laid out in the lower region 100b are not particularly limited. However, it is preferable to set such that the banks in the upper region 100a are accessed when a predetermined bit of the bank address is the first logic level, and the banks in the lower region 100b are accessed when the predetermined bit is the second logic level.

Figure 6:
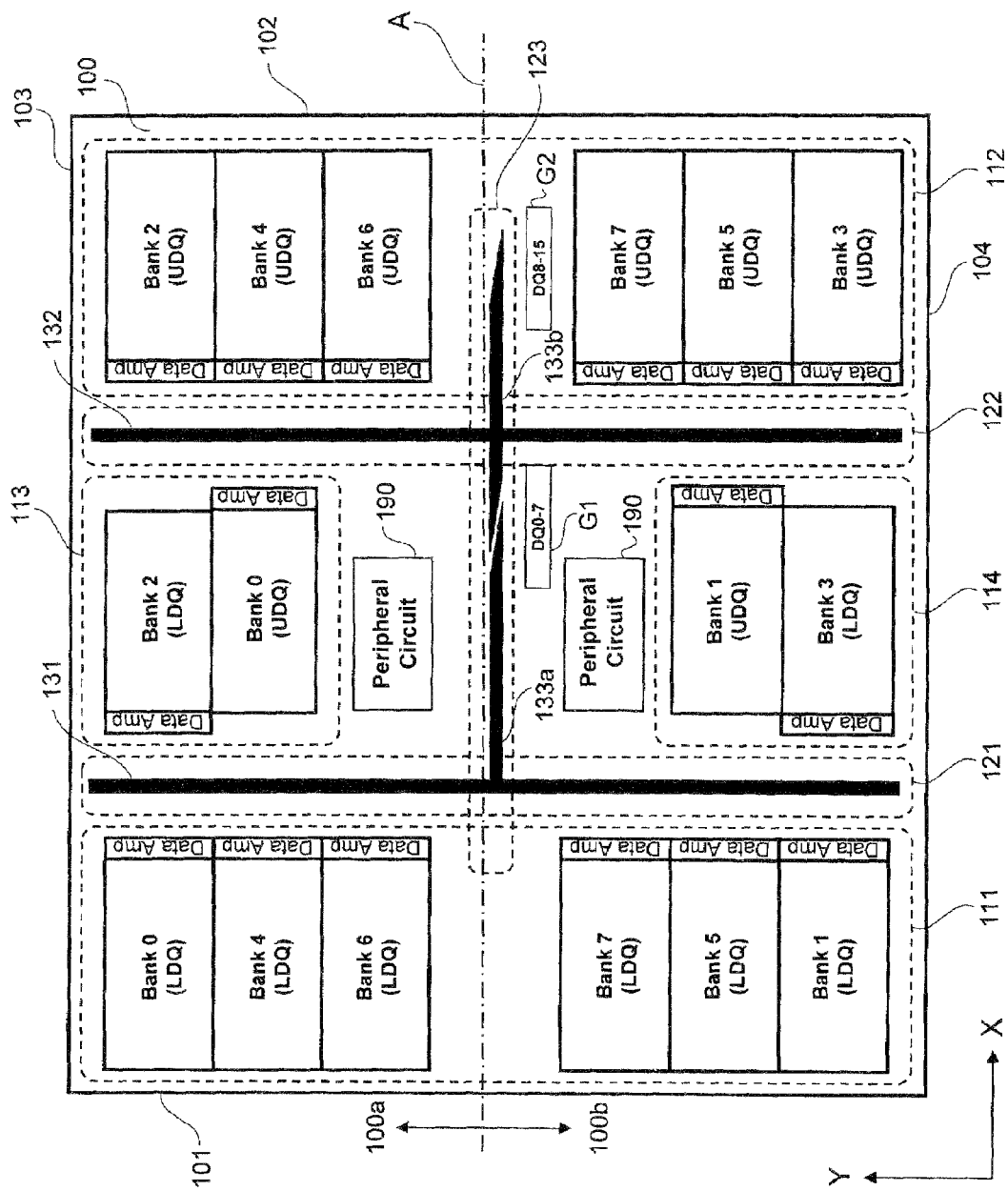
FIG. 6 is a schematic plan view for explaining the floor plan of the semiconductor memory device according to a fifth embodiment of the present invention.

FIG. 6 is a schematic plan view for explaining the floor plan of the semiconductor memory device according to a fifth embodiment of the present invention.

As shown in FIG. 6, the semiconductor memory device according to the fifth embodiment is different from the semiconductor memory device according to the second embodiment in that the positions of the two memory cell arrays laid out in the cell region 113 are inverted, and that the positions of the two memory cell arrays laid out in the cell region 114 are inverted. Other points are the same as those of the second embodiment. Therefore, elements identical with those of the second embodiment are assigned with like reference numerals, and redundant explanations thereof will be omitted.

As explained above, while the low-side memory cell arrays LDQ and the high-side memory cell arrays UDQ are present in mixture in the cell regions 113 and 114, the positions of these memory cell arrays are not particularly limited, and can be switched.

Figure 7:
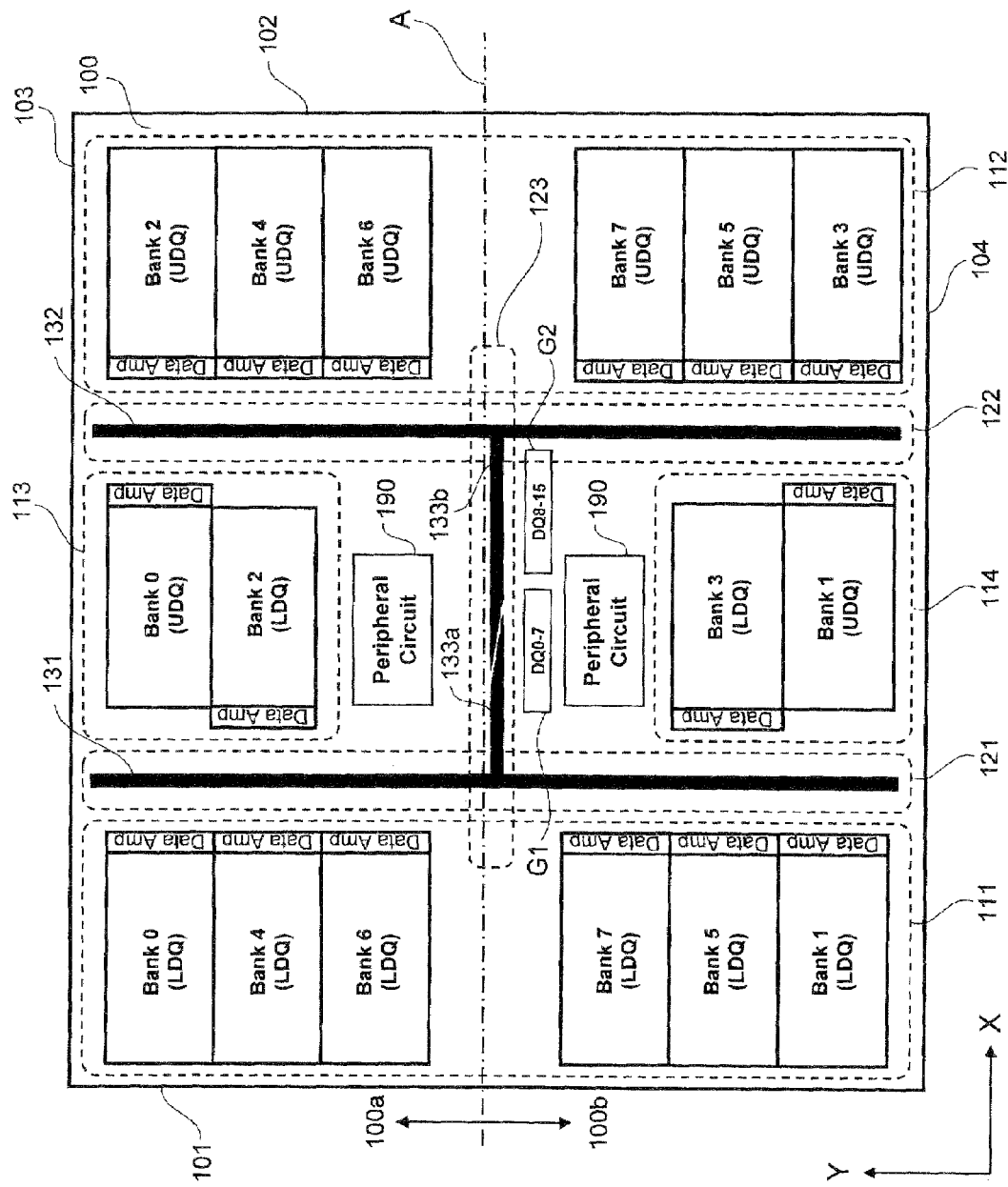
FIG. 7 is a schematic plan view for explaining the floor plan of the semiconductor memory device according to a sixth embodiment of the present invention.

FIG. 7 is a schematic plan view for explaining the floor plan of the semiconductor memory device according to a sixth embodiment of the present invention.

As shown in FIG. 7, in the semiconductor memory device according to the sixth embodiment, the group G2 of the data input/output pad string is laid out between the bus regions 121 and 122. Other points are the same as those of the second embodiment. Therefore, elements identical with those of the second embodiment are assigned with like reference numerals, and redundant explanations thereof will be omitted.

Because the wiring length of the I/O bus 133 becomes short with this structure, the parasitic capacitance of the total I/O buses can be decreased. While it is difficult to obtain a complete coincidence between the wiring length of the first part 133*a* and the wiring length of the second part 133*b*, it is preferable to make the layouts to obtain substantially the same wiring lengths.

Figure 8:
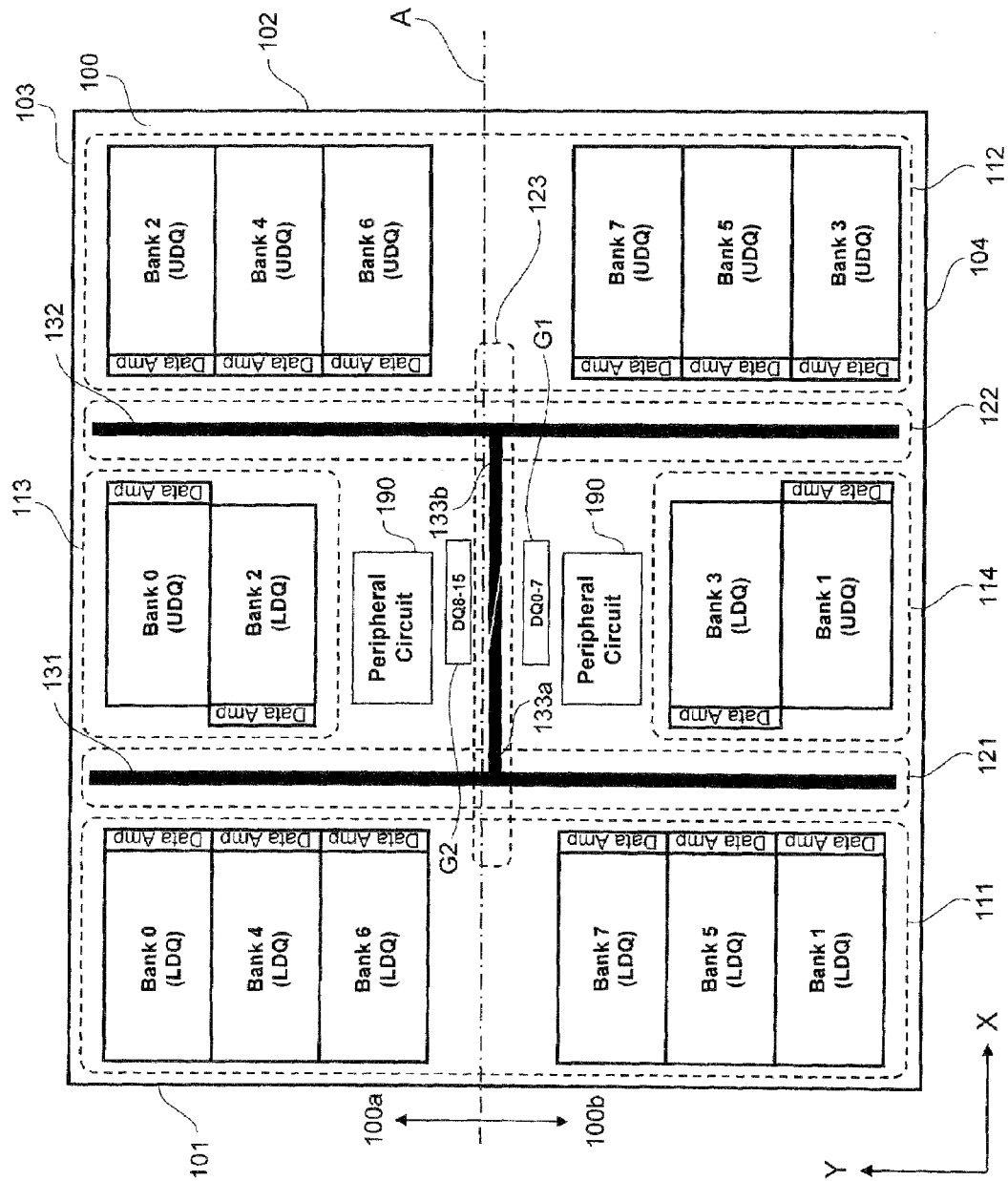
FIG. 8 is a schematic plan view for explaining the floor plan of the semiconductor memory device according to a seventh embodiment of the present invention.

FIG. 8 is a schematic plan view for explaining the floor plan of the semiconductor memory device according to a seventh embodiment of the present invention.

As shown in FIG. 8, in the semiconductor memory device according to the seventh embodiment, the groups G1 and G2 of the data input/output pad string are laid out at positions facing each other across the bus region 123. Other points are the same as those of the sixth embodiment. Therefore, elements identical with those of the sixth embodiment are assigned with like reference numerals, and redundant explanations thereof will be omitted.

With this structure, the wiring lengths of the first part 133*a* and the second part 133*b* can be easily coincided with each other, while decreasing the wiring length of the I/O bus 133.

Figure 9:
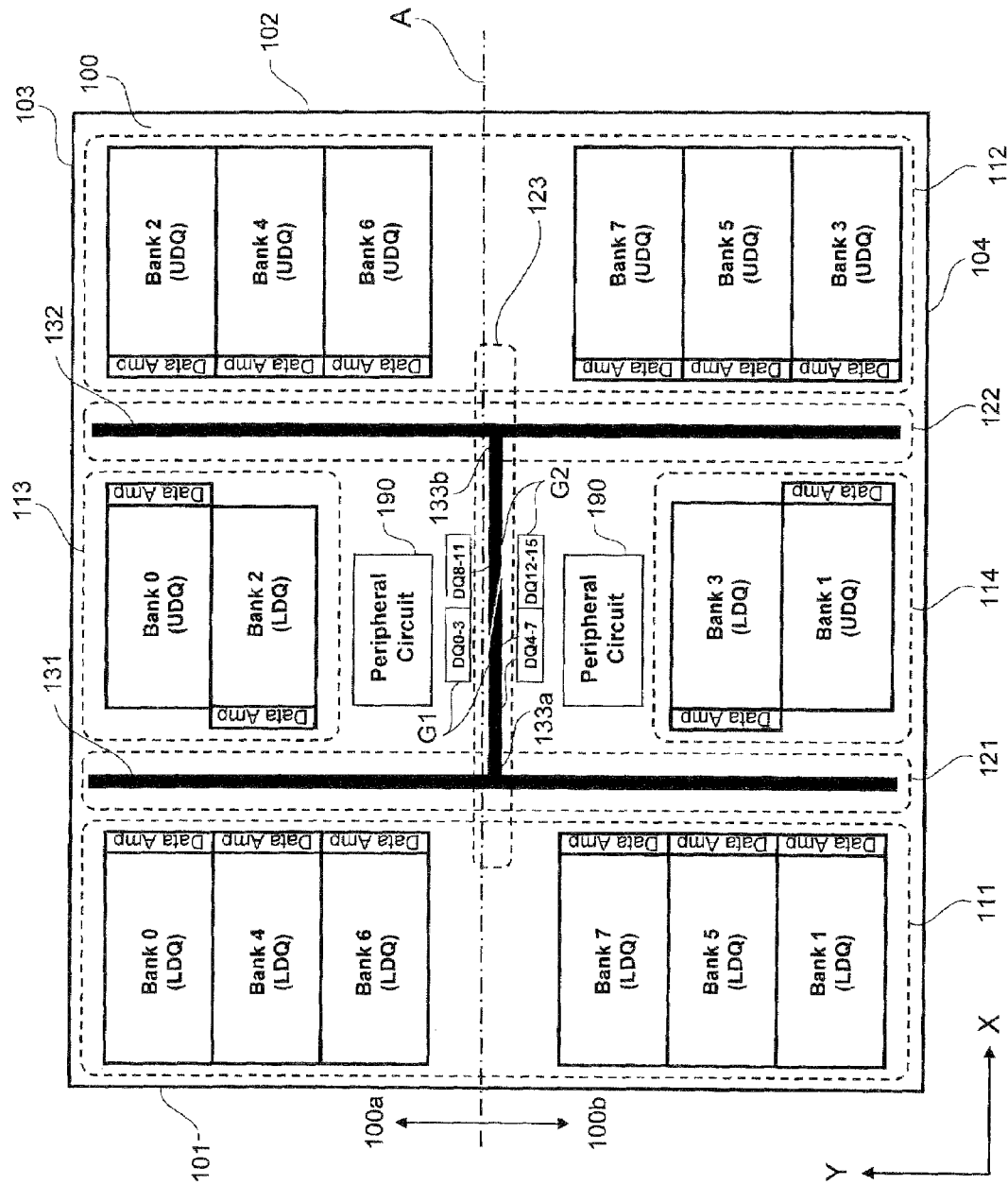
FIG. 9 is a schematic plan view for explaining the floor plan of the semiconductor memory device according to an eighth embodiment of the present invention.

FIG. 9 is a schematic plan view for explaining the floor plan of the semiconductor memory device according to an eighth embodiment of the present invention.

As shown in FIG. 9, in the semiconductor memory device according to the eighth embodiment, each half of the data input/output pads constituting the group G1 of the data input/output pad string is laid at each of opposing positions across the bus region 123. Similarly, each half of the data input/output pads constituting the group G2 is laid at each of opposing positions across the bus region 123. Other points are the same as those of the seventh embodiment. Therefore, elements identical with those of the seventh embodiment are assigned with like reference numerals, and redundant explanations thereof will be omitted.

With this structure, the wiring lengths of the first part 133*a* and the second part 133*b* can be easily coincided with each other, while decreasing the wiring length of the I/O bus 133.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

For example, although the semiconductor memory device according to any of the above embodiments has the eight-bank structure, the present invention is not limited thereto.

What is claimed is:

1. A semiconductor memory device having a square planar shape, and having first and second sides extending in a first direction and third and fourth sides extending in a second direction intersecting with the first direction, the semiconductor memory device comprising:

first and second bus regions extending in the first direction;
a third bus region laid out along a center line separating the semiconductor memory device into two in the first direction;
a first cell region laid out between the first side and the first bus region;
a second cell region laid out between the second side and the second bus region;
a third cell region laid out between the first bus region and the second bus region and located at the third side seen from the third bus region;
a fourth cell region laid out between the first bus region and the second bus region and located at the fourth side seen from the third bus region; and
a data input/output pad string laid out along the third bus region,
wherein
the data input/output pad string includes first and second groups each including n data input/output pads,
the semiconductor memory device performs a data input operation or a data output operation using the first group without using the second group, when an input/output data width is set to n bits, and
the semiconductor memory device performs the data input operation or the data output operation using the first and second groups in parallel, when the input/output data width is set to 2n bits.

2. The semiconductor memory device as claimed in claim 1, wherein the first group of the data input/output pad string is laid out between the first bus region and the second bus region.

3. The semiconductor memory device as claimed in claim 2, wherein the second group of the data input/output pad string is laid out between the second side and the second bus region.

4. The semiconductor memory device as claimed in claim 2, wherein the second group of the data input/output pad string is laid out between the first bus region and the second bus region.

5. The semiconductor memory device as claimed in claim 4, wherein the first and second groups of the data input/output pad string are laid out at positions facing each other across the third bus region.

6. The semiconductor memory device as claimed in claim 2, wherein each half of the data input/output pads constituting the first group of the data input/output pad string is laid out at each of positions facing each other across the third bus region.

7. The semiconductor memory device as claimed in claim 1, wherein a first data input/output bus formed in the first bus region can transfer data to/from the data input/output pads constituting the first group of the data input/output pad string, and a second data input/output bus formed in the second bus region can transfer data to/from the data input/output pads constituting either the first group or the second group of the data input/output pad string.

8. The semiconductor memory device as claimed in claim 7, wherein a third data input/output bus formed in the third bus region includes a first part connected to the first data input/output bus, and a second part connected to the second data input/output bus, and
wiring lengths of the first part and the second part of the third data input/output bus are substantially equal to each other.

9. The semiconductor memory device as claimed in claim 8, wherein the first group of the data input/output pad string is laid out near the boundary between the first part and the second part of the third data input/output bus.

10. The semiconductor memory device as claimed in claim 8, wherein each of the first and the second data input/output buses includes a first part located toward the third side seen from the center line, and a second part located toward the fourth side seen from the center line, the first part of the first data input/output bus is connected to a memory cell array located toward the third side seen from the center line out of memory cell arrays laid out in the first cell region, and part of memory cell arrays laid out in the third cell region, the second part of the first data input/output bus is connected to a memory cell array located toward the fourth side seen from the center line out of the memory cell arrays laid out in the first cell region, and part of memory cell arrays laid out in the fourth cell region, the first part of the second data input/output bus is connected to a memory cell array located toward the third side seen from the center line out of memory cell arrays laid out in the second cell region, and a remaining part of the memory cell arrays laid out in the third cell region, and the second part of the second data input/output bus is connected to a memory cell array located toward the fourth side seen from the center line out of the memory cell arrays laid out in the second cell region, and a remaining part of the memory cell arrays laid out in the fourth cell region.

11. The semiconductor memory device as claimed in claim 10, wherein the first part of the first data input/output bus is connected to a half of the first part of the third data input/output bus, the second part of the first data input/output bus is connected to a remaining half of the first part of the third data input/output bus, the first part of the second data input/output bus is connected to a half of the second part of the third data input/output bus, and the second part of the second data input/output bus is connected to a remaining half of the second part of the third data input/output bus.

12. The semiconductor memory device as claimed in claim 10, wherein the first and the second parts of the first data input/output bus are connected in common to the first part of the third data input/output bus, and the first and the second parts of the second data input/output bus are connected in common to the second part of the third data input/output bus.

13. The semiconductor memory device as claimed in claim 10, further comprising:

a first selector that connects one of the first part and the second part of the first data input/output bus to the first part of the third data input/output bus, and a second selector that connects one of the first part and the second part of the second data input/output bus to the second part of the third data input/output bus.

14. The semiconductor memory device as claimed in claim 1, wherein a plurality of memory cell arrays laid out in the first cell region are connected to the first group of the data input/output pad string when the input/output data width is set to 2n bits, and a plurality of memory cell arrays laid out in the second cell region are connected to the second group of the data input/output pad string when the input/output data width is set to 2n bits.

15. The semiconductor memory device as claimed in claim 14, wherein parts of memory cell arrays laid out in the third and fourth cell regions are connected to the first group of the data input/output pad string when the input/output data width is set to 2n bits, and remaining parts of memory cell arrays laid out in the third and fourth cell regions are connected to the second group of the data input/output pad string when the input/output data width is set to 2n bits.

16. The semiconductor memory device as claimed in claim 14, wherein the plurality of memory cell arrays formed in the first to the fourth cell regions are separated into 2m banks, and m banks are laid out in a first side region including a part located toward the third side seen from the center line out of the first and the second cell regions, and the third cell region, and remaining m banks are laid out in a second side region including a part located toward the fourth side seen from the center line out of the first and the second cell regions, and the fourth cell region.

17. The semiconductor memory device as claimed in claim 16, wherein the m banks laid out in the first side region can be accessed when a predetermined bit of a bank address is at a first logic level, and the m banks laid out in the second side region can be accessed when the predetermined bit of the bank address is at a second logic level different from the first logic level.

18. The semiconductor memory device as claimed in claim 1, wherein peripheral circuits are laid out in concentration between the third cell region and the fourth cell region.

19. A semiconductor memory device that can perform data input/output with a variable input/output data width, comprising:

a data input/output pad string including first and second groups each of which have n data input/output pads; and first to third data input/output buses, wherein the first group of the data input/output pad string is used when the input/output data width is set to n bits, the first and the second groups of the data input/output pad string are used in parallel when the input/output data width is set to 2n bits, the third data input/output bus includes a first part that connects between the first data input/output bus and the first group of the data input/output pad string, and a second part that connects between the second data input/output bus and either the first group or the second group of the data input/output pad string, and the first and the second data input/output buses extend in a first direction in parallel, the third data input/output bus extends in a second direction intersecting with the first direction, and wiring lengths of the first and second parts of the third data input/output bus are substantially equal to each other.

20. The semiconductor memory device as claimed in claim 19, wherein at least the first group of the data input/output pad string is laid out at approximately the center of The semiconductor memory device.

21. The semiconductor memory device as claimed in claim 19, wherein the first group of the data input/output pad string is laid out near the boundary between the first part and the second part of the third data input/output bus.

22. A semiconductor memory device having a square planar shape, and having first and second sides extending in a first direction and third and fourth sides extending in a second direction intersecting with the first direction, the semiconductor memory device comprising:

first and second bus regions extending in the first direction;

a third bus region laid out along a center line separating the semiconductor memory device into two in the first direction;

a first cell region laid out between the first side and the first bus region and containing m banks which belong to a first group;

a second cell region laid out between the second side and the second bus region and containing m banks which belong to a second group;

a third cell region laid out between the first bus region and the second bus region and located at the third side seen from the third bus region, and containing less than m/2 banks that each belongs to either the first or second group;

a fourth cell region laid out between the first bus region and the second bus region and located at the fourth side seen from the third bus region, and containing less than m/2 banks that each belongs to either the first or second group; and a data input/output pad string laid out along the third bus region, wherein the data input/output pad string includes sets of n data input/output pads, wherein each of the sets corresponds to either the first or second group, the semiconductor memory device performs a data input operation or a data output operation using the first group without using the second group, when an input/output data width is set to n bits, and the semiconductor memory device performs the data input operation or the data output operation using the first and second groups in parallel, when the input/output data width is set to 2n bits.

* * * * *